July 17, 1951 E. I. ANDERSON 2,561,089

FREQUENCY MODULATION RATIO DETECTOR

Filed Jan. 30, 1948

INVENTOR
EARL I. ANDERSON
BY Philip G. Cooper
ATTORNEY

Patented July 17, 1951 2,561,089

UNITED STATES PATENT OFFICE 2,561,089

FREQUENCY MODULATION RATIO DETECTOR

Earl I. Anderson, Manhasset, N. Y., assignor to Radio Corporation of America, a corporation of Delaware Application January 30, 1948, Serial No. 5,406

12 Claims. (Cl. 250—27)

This invention relates generally to circuits for demodulating an angle-modulated carrier wave, and particularly relates to a ratio detector having a minimum response to coincidental amplitude modulation of an angle-modulated carrier wave.

Various circuits have been devised in the past for demodulating an angle-modulated carrier wave. The term "angle-modulated carrier wave" is meant to include either a frequency-modulated or a phase-modulated carrier wave or hybrid forms of modulation possessing characteristics common to both of them. During the generation, transmission, or reception of an angle-modulated carrier wave, an undesired amplitude modulation of the carrier may arise. This may be caused by the transmitter, by the combination of the modulated carrier-wave with interfering impulses such as external noise, by the lack of uniform gain over the entire pass band of the receiver signal-selector, or, finally, the undesired amplitude modulation may be caused by interference between waves which have traveled over different paths between the transmitter and the receiver.

Most prior art demodulators for angle-modulated carrier waves are also responsive to amplitude modulation. The ratio detector, however, which is a particular type of demodulator for angle-modulated waves, is, in first approximation, not responsive to the undesired amplitude modulation of an angle-modulated carrier wave. A ratio detector of the type referred to has been described on pages 140 to 147 of the book "F-M Simplified" by Milton S. Kiver, published in 1947 by D. Van Nostrand Co., Inc., New York, New York.

The ratio detector makes it possible to eliminate one or more stages of amplification and the amplitude-limiter stage required in other conventional frequency demodulators to remove the normally present coincidental amplitude modulation of an angle-modulated carrier wave Consequently, a radio receiver including a ratio detector requires fewer tubes and circuit elements than a receiver having a conventional frequency demodulator. One reason for the improved performance of the ratio detector is that it responds to the ratio of two voltages derived from its two load impedances, and this ratio remains constant, in first approximation, notwithstanding variations in amplitude of the modulated carrier-wave. It is, however, desirable to provide a ratio detector which has a better rejection of the coincidental amplitude modulation of an angle-modulated carrier wave than has heretofore been obtainable.

It is, accordingly, the principal object of the present invention to provide an improved ratio detector which is less responsive to coincidental amplitude modulation of an angle-modulated carrier wave than previously known ratio detectors.

A further object of the invention is to provide a ratio detector which will have a minimum unbalanced amplitude-modulation component whereby the response of the detector to coincidental amplitude modulation is a minimum in the neighborhood of the center frequency of the modulated carrier wave.

A ratio detector of the type described in the book referred to above may utilize, for example, a frequency-discriminator network to which are coupled two rectifiers such, for example, as vacuum diodes. A resistor may be connected to the output of the rectifiers to form a direct current path therewith. A stabilizing condenser of low impedance to modulation-frequency currents bypasses the resistor. Hence, a bias voltage for the rectifiers is developed across the stabilizing condenser and its resistor. A load condenser of high impedance to modulation-frequency currents is connected from a point on the frequency-discriminator network to the junction point between the resistor and one of the rectifiers.

In brief, and in accordance with the present invention, a resistance element, such as a resistor, is connected in series with the ratio detector load condenser to minimize its response to undesired amplitude-modulation components of the carrier wave. The resistance of this series resistor should be of the order of the effective impedance of the rectifiers. Alternatively, the same result may be achieved by making the reactive impedance of the load condenser to the carrier wave of the order of the effective impedance of the rectifiers. A combination of both expedients may be employed, as will appear more fully below.

The novel features that are considered characteristic of this invention are set forth with particularity in the appended claims. The invention itself, however, both as to its organization and method of operation, as well as additional objects and advantages thereof, will be understood best from the following description, when read in connection with the accompanying drawing, in which:

Figure 1:
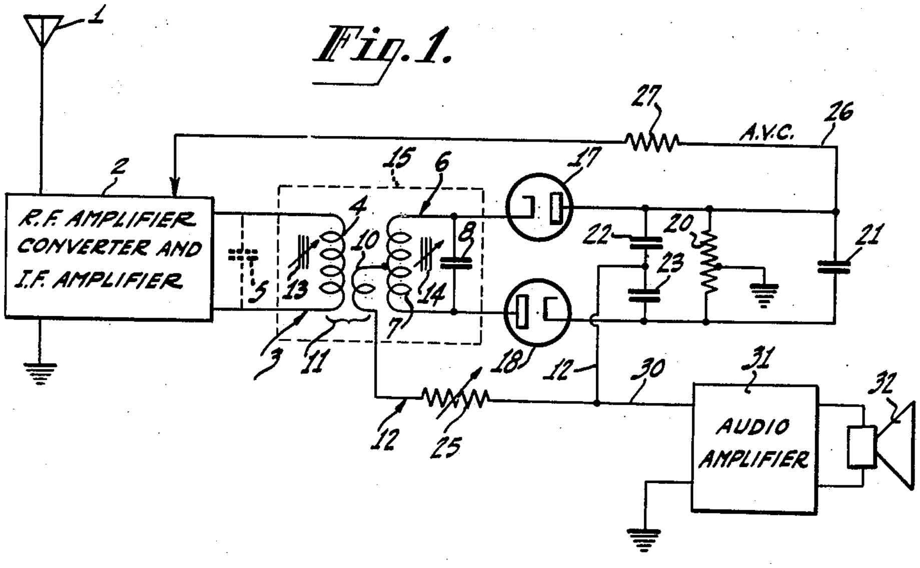
Fig. 1 is a circuit diagram, partly in block form, of a radio receiver for receiving an angle-modulated carrier wave and including a ratio detector embodying the present invention.

Referring now to Fig. 1 there is illustrated a superheterodyne radio receiver for receiving an angle-modulated carrier wave which may be intercepted by antenna 1. The carrier wave may be amplified by one or more radio-frequency amplifiers, converted to an intermediate-frequency wave and further amplified by one or more intermediate-frequency amplifiers, the necessary components being generally indicated by box 2, in accordance with conventional practice.

It will be understood that radio-frequency amplifier, converter and intermediate-frequency amplifier 2 are adapted to amplify not only frequency-modulated carrier waves but also phase-modulated waves. A frequency-modulated wave is developed at a transmitter by varying the frequency of the carrier wave about its center or mean frequency in proportion to the amplitude of the modulating signal and at a speed depending upon the frequency of the modulating signal. A phase-modulated wave differs from a frequency-modulated wave in that the frequency deviation from the center frequency increases with the frequency of the modulating signal. Thus, the generic expression "angle modulation" also includes a modulated carrier wave of preferably constant amplitude where the modulation contains components resembling both frequency and phase modulation and is therefore a hybrid modulation.

The intermediate-frequency wave to which the intercepted carrier wave is converted has conventionally a frequency of 10.7 megacycles in present frequency-modulated carrier-wave receivers. The last intermediate-frequency amplifier or driver stage included within box 2 has its output coupled to primary circuit 3 forming part of the frequency-discriminator network of the ratio detector. Primary circuit 3 includes primary coil 4 which may be broadly tuned to the intermediate frequency by the distributed capacitance of coil 4 and by the interelectrode capacitance of the driver stage as indicated at 5. The secondary circuit 6 includes secondary coil 7 and condenser 8 arranged in parallel. Coils 4 and 7 are inductively coupled to each other.

Tertiary coil 10 is very tightly coupled to primary coil 4 as indicated by bracket 11. The high alternating-potential terminal of tertiary coil 10 is connected to the midpoint of secondary coil 7. The low alternating-potential terminal of tertiary coil 10 is connected to lead 12. Primary circuit 3 may be tuned to the center frequency by a magnetically permeable core or slug 13 while secondary circuit 6 may be tuned by slug 14. In order to prevent unbalancing of secondary circuit 6 by a movement of slug 14 secondary coil 7 preferably consists of two bifilar sections. The frequency-discriminator network which includes primary circuit 3 and secondary circuit 6 preferably is enclosed by a shield or can indicated by dotted lines 15.

Two rectifiers such as first and second vacuum diodes 17 and 18, which may be twin diodes or dry rectifiers, are provided for rectifying the intermediate-frequency wave. The cathode of first diode 17 and the anode of second diode 18 are each connected to one terminal of secondary circuit 6. On the other hand, the anode of first diode 17 and the cathode of second diode 18 which form the output electrodes of the diodes are interconnected through resistor 20 to form a direct current path. As illustrated in Fig. 1 the midpoint of resistor 20 may be connected to ground to provide a balanced ratio detector. Stabilizing condenser 21 is connected in parallel with resistor 20. The network consisting of resistor 20 and stabilizing condenser 21 preferably has a long time constant of the order of 0.1 second. This network provides a bias voltage for diodes 17, 18 which is only permitted to vary slowly compared to a cycle of the modulation signal.

A pair of load condensers 22 and 23 arranged in series is connected in parallel with resistor 20.

In accordance with the present invention load condensers 22 and 23 may have a reactive impedance to intermediate-frequency currents which is appreciable and of the order of the effective impedance of diodes 17 and 18, as will be more fully explained hereinafter.

Furthermore, in accordance with the present invention there may be provided a series resistor 25 in lead 12 connecting the low alternating-potential terminal of tertiary coil 10 to the junction point between load condenser 22 and 23. Thus, resistor 25 is provided in series with load condenser 23.

An automatic volume control voltage may be derived from the junction point between stabilizing condenser 21 and the anode of diode 17. The automatic volume control voltage which is of negative polarity may be impressed through lead 26 and filter resistor 27 upon one or more of the intermediate-frequency amplifier stages included within box 2, which is conventional.

The demodulated audio signal is developed across load condenser 23 and may be derived from lead 30 connected to lead 12. The audio signal may be impressed through lead 30 on audio amplifier 31 and reproduced by loud speaker 32.

The ratio detector illustrated in Fig. 1 responds to angle-modulated carrier waves in the following manner. When the frequency of the carrier wave is equal to the center frequency, the currents through diodes 17 and 18 are equal in magnitude, and no audio signal is derived from lead 30. However, when the frequency of the carrier wave deviates from the center frequency, the frequency-discriminator network becomes unbalanced, and the currents through diodes 17 and 18 are consequently of unequal magnitude. Since the voltage across stabilizing condenser 21 and resistor 20 is maintained substantially constant for short time variations of the order of the audio frequency, the voltage at the junction point of load condensers 22 and 23 varies with the frequency of the audio signal. It will further be observed that since the voltage across load condensers 22 and 23 is maintained substantially constant for short time variations, the audio output voltage derived across load condenser 23 will not, in first approximation, be responsive to undesired variations of the amplitude of the modulated carrier-wave.

Figures 2, 3:
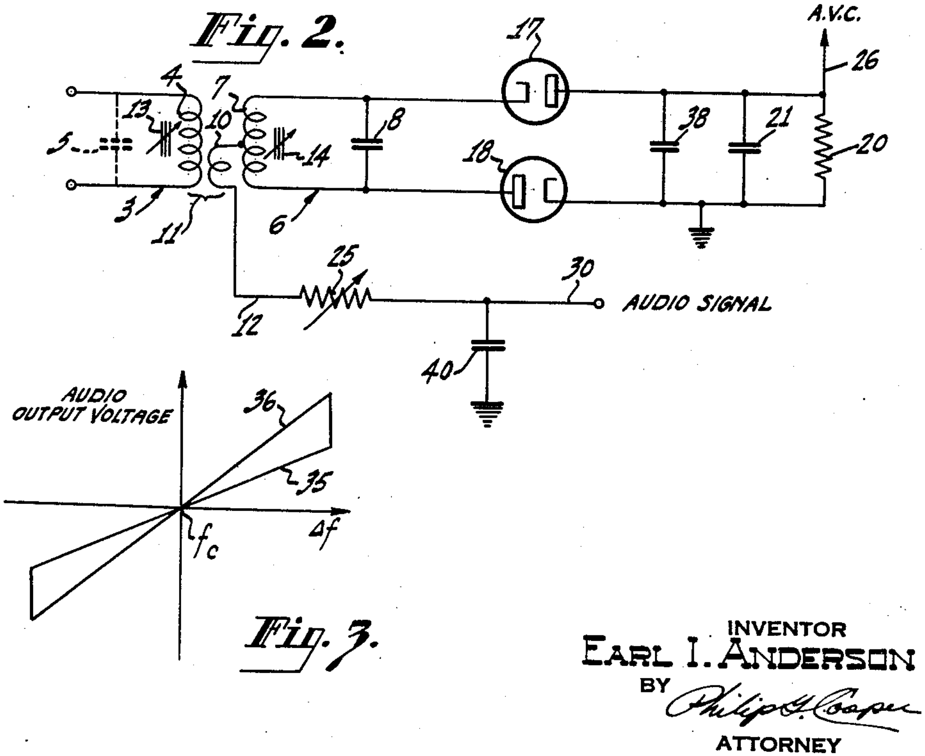
Fig. 2 is a circuit diagram of a modified ratio detector in accordance with the invention.
Fig. 3 is a graph illustrating the audio output voltage of a conventional ratio detector plotted against the frequency deviation of the input wave from the center frequency.

However, a conventional ratio detector, that is, the ratio detector of Fig. 1 without series resistor 25 and where load condensers 22, 23 have a negligible impedance to intermediate-frequency currents, is, to a certain extent, responsive to variations of the amplitude of an angle-modulated carrier wave. Referring now to Fig. 3 there is illustrated the audio output voltage of such a conventional ratio detector in response to variations $\Delta f$ of the frequency of the input wave from the center frequency $f_c$. Lines 35 and 36 indicate how the instantaneous audio output voltage varies for any given frequency deviation from the center frequency when the input wave impressed on the ratio detector has simultaneously its amplitude modulated. A conventional ratio detector may also have an unbalanced amplitude-modulation component of the modulated wave. In that case, lines 35 and 36 do not intersect each other at the center frequency $f_c$ but at some other frequency or lines 35 and 36 may be parallel. This effect is very undesirable because the response of the ratio detector to the modulation signal is not symmetrical with respect to the center frequency. As will be explained presently, the ratio detector of the invention will have substantially no unbalanced amplitude-modulation component of the modulated wave and its response to coincidental amplitude modulation may be considerably reduced compared to that of a conventional ratio detector.

The exact cause or causes for the response of the ratio detector to coincidental amplitude modulation of the modulated carrier wave is not quite understood at the present time. It is believed, however, that the following factors contribute to the undesired amplitude-modulation response of the ratio detector. When the amplitude of the angle-modulated carrier wave varies, secondary circuit 6 is dynamically detuned. In other words, the resonant frequency of secondary circuit 6 varies to a certain extent with the amplitude of the modulated carrier wave, and accordingly, the resonant frequency of secondary circuit 6 no longer coincides with the center frequency of the modulated wave. This is believed to be due to changes of the input capacitance of diodes 17, 18 with changes in the average current flowing through the diodes which varies with the amplitude of the modulated wave. Furthermore, when the amplitude of the modulated carrier wave changes, the harmonics of the intermediate-frequency wave will vary in magnitude. Finally, the voltage impressed upon primary circuit 3 will not have an exact phase quadrature with that induced in secondary circuit 6.

It has been found in accordance with the present invention that the response of the ratio detector to coincidental amplitude modulation of the modulated wave may be considerably reduced by providing series resistor 25. It will be observed that series resistor 25 is provided in lead 12 which carries the intermediate-frequency currents flowing through both diodes 17 and 18. In other words, lead 12 and series resistor 25 provide a common return path for the intermediate-frequency currents flowing from secondary circuit 6 through diodes 17 and 18 and through load condensers 22 and 23 respectively. The presence of resistor 25 in series with load condenser 23 makes the performance of the ratio detector of the invention more independent of changes of the signal level, that is, the amplitude of the modulated wave. Thus, series resistor 25 modifies the peak currents through diodes 17 and 18. Furthermore, the resistance of series resistor 25 will change the impedance of the circuit to the harmonics of the modulated carrier wave. Finally, resistor 25 will change the phase relationship of the voltage in primary coil 4 and the induced voltage in secondary coil 7 at the fundamental frequency, that is, the intermediate-frequency carrier wave. However, the exact reason why series resistor 25 reduces the response of the ratio detector to coincidental amplitude modulation of the modulated carrier wave is not yet clearly understood.

The resistance of resistor 25 should be of the order of 40 to 400 ohms and may in a practical ratio detector amount to approximately 100 ohms. The resistance of series resistor 25 preferably should be comparable to the effective impedance of diodes 17 and 18 which is of the order of between 100 and 1,000 ohms.

In accordance with the present invention, the capacitive reactance of load condensers 22 and 23 should also be of the order of the effective impedance of diodes 17 and 18. The effect of utilizing load condensers having an appreciable impedance for intermediate-frequency currents is substantially the same as that of providing series resistor 25. The impedance of load condensers 22, 23 determines particularly the extent of the dynamic detuning of secondary circuit 6 in response to undesired variations of the amplitude of the modulated wave. Thus, either resistor 25 may be provided, or load condensers 22 and 23 may be used having an appreciable impedance for intermediate-frequency currents or both expedients may be utilized simultaneously. Load condensers 22 and 23 may have an impedance of between 1500 and 30 ohms corresponding to a capacitance of between 10 and 500 micromicrofarads at an intermediate frequency of 10.7 megacycles. In a ratio detector in accordance with the invention load condensers 22 and 23 may each have a capacitive reactance of 160 ohms corresponding to a capacitance of 100 micromicrofarads at an intermediate frequency of 10.7 megacycles.

For any ratio detector the resistance of series resistor 25 and the capacitance of load condensers 22 and 23 may be selected by observing on a cathode ray oscilloscope the audio output voltage for a frequency-modulated input wave having its amplitude varied simultaneously. The resistance of series resistor 25 and the capacitance of load condensers 22 and 23 should be adjusted until the trace of the audio output voltage intersects the base line at the center frequency $f_c$ and until the trace of the audio output voltage approaches a single angularly disposed line, notwithstanding variations of the amplitude of the modulated input wave.

Referring now to Fig. 2 in which like components are designated by the same reference numerals as were used in Fig. 1, there is illustrated a modified ratio detector in accordance with the present invention. The ratio detector comprises a frequency-discriminator network including primary circuit 3 inductively coupled to secondary circuit 6. Primary circuit 3 may, for example, be connected to an intermediate-frequency amplifier such as is included within box 2 of Fig. 1 to impress an angle-modulated wave thereon. The cathode of diode 17 and the anode of diode 18 are connected to the terminals of secondary circuit 6. For the purpose of providing a diode bias voltage there is provided resistor 20 bypassed by stabilizing condenser 21 and having their terminals connected to the anode of diode 17 and the cathode of diode 18 respectively. Stabilizing condenser 21 is of low impedance to modulation-frequency currents. Stabilizing condenser 21 may have a capacitance of the order of approximately 5 microfarads and therefore may consist of an electrolytic condenser. Since an electrolytic condenser will not readily bypass radio-frequency or intermediate-frequency currents, it may be preferred to provide radio-frequency bypass condenser 38 in parallel with stabilizing condenser 21. However, radio-frequency bypass condenser 38 is not essential for the operation of the ratio detector because stabilizing condenser 21 may be arranged to function as a radio-frequency bypass condenser.

The junction point between resistor 20 and the cathode of diode 18 may be grounded as illustrated. An automatic volume control voltage may be derived from lead 26, that is, from the junction point between resistor 20 and the anode of diode 17. Since one terminal of resistor 20 of the circuit of Fig. 2 is grounded a larger automatic volume control voltage may be derived from the ratio detector of Fig. 2 than may be obtained from the circuit of Fig. 1 where the midpoint of resistor 20 is grounded.

The ratio detector of Fig. 2 has only one load condenser 40 which is connected between lead 12 connected, in turn, to the low alternating-potential terminal of tertiary coil 10 and ground. Since the cathode of diode 18 is also connected to ground load condenser 40 is effectively provided between the cathode of diode 18 and the low alternating-potential terminal of tertiary coil 10. The demodulated audio signal may be derived from output lead 30 to which may be connected an audio amplifier such as illustrated at 31 in Fig. 1.

The ratio detector of Fig. 2 responds to angle-modulated carrier waves in the same manner as does the circuit of Fig. 1. Series resistor 25 has the same function and effect as resistor 25 of the circuit of Fig. 1. As far as the operation of the ratio detector of Fig. 2 is concerned, it is immaterial whether one load condenser 40, as shown in Fig. 2, is used, or whether there are provided two load condensers 22, 23, as illustrated in Fig. 1. The capacitance value of load condenser 40 should be approximately twice the capacitance value of each load condenser 22 and 23. Thus, load condenser 40 may have a capacitance of 200 micromicrofarad for an intermediate frequency of 10.7 megacycles corresponding to a capacitive reactance of 80 ohms at that frequency. The proper capacitance value of load condenser 40 may be selected for any ratio detector in the manner described hereinabove. It is to be understood that the capacitive reactance of load condensers 40 to intermediate-frequency currents is still of the order of the effective impedance of diodes 17 and 18.

There has thus been provided in accordance with the present invention a ratio detector which is less responsive to coincidental amplitude modulation of an angle-modulated carrier wave than previously known ratio detectors. In particular, the ratio detector has substantially no unbalanced amplitude-modulation component of the modulated carrier wave so that the response of the detector to coincidental amplitude modulation is substantially zero in the neighborhood of the center frequency of the modulated carrier wave. This is accomplished either by providing a resistor in the common return path of the rectifiers of the ratio detector or by selecting a load condenser or load condensers of a reactive impedance to the carrier wave which is of the order of the effective impedance of the rectifiers. It is also feasible to utilize both expedients together.

What is claimed is:

1. A ratio detector for demodulating an angle-modulated carrier wave including a frequency-discriminator network, a pair of rectifiers coupled to said network, a rectifier output circuit connected to said rectifiers for deriving a modulation output voltage, a resistor and a condenser connected in parallel, said resistor being connected to said rectifiers to form a series path with said rectifiers, said resistor and condenser having a time constant that is long compared to a cycle of said modulation output voltage, and a circuit connection between said network and said rectifier output circuit, said circuit connection including a resistance of a value chosen to minimize the response by said detector to an undesired amplitude-modulation component of the wave.

2. A ratio detector for demodulating an angle-modulated carrier wave comprising a frequency-discriminator network, a pair of rectifiers coupled to said network, a resistor connected to the output of said rectifiers to form a direct current path with said rectifiers, a first condenser of low impedance to modulation-frequency currents bypassing said resistor, a second load condenser of high impedance to modulation-frequency currents connected from a point on said network to the junction point between said resistor and one of said rectifiers, and a resistance element connected in series with said second load condenser to improve the rejection by said detector of an undesired amplitude-modulation component of said wave.

3. A ratio detector for demodulating an angle-modulated carrier wave comprising a frequency-discriminator network, a pair of rectifiers coupled to said network, a resistor connected to the output of said rectifiers to form a direct current path with said rectifiers, a first condenser of low impedance to modulation-frequency currents bypassing said resistor, a second load condenser of high impedance to modulation-frequency currents coupled between a point on said network and the junction point between said resistor and one of said rectifiers, a further resistor connected for carrier-frequency currents between said network and the output of said rectifiers to improve the rejection by said detector of an undesired amplitude-modulation component of said wave, and a circuit coupled to said second load condenser for deriving a modulation output voltage from said detector.

4. A ratio detector for demodulating an angle-modulated carrier wave comprising a frequency-discriminator network, a pair of rectifiers connected individually to separate points of said network, a resistor connected to the output of said rectifiers to form a direct current path with said rectifiers, a first condenser of low impedance to modulation-frequency currents bypassing said resistor, a pair of load condensers of high impedance to modulation-frequency currents connected in parallel with said resistor, and a further resistor connected in series between the junction point between said pair of condensers and another point on said network to improve the rejection by said detector of an undesired amplitude-modulation component of said wave.

5. A ratio detector for demodulating an angle-modulated carrier wave comprising a frequency discriminator network, said network including a transformer having a primary winding, a secondary winding and a tertiary winding having one terminal connected to the midpoint of said secondary winding, a pair of rectifiers connected individually to the terminals of said secondary winding, a resistor connected to the output of said rectifiers to form a direct current path with said rectifiers, a first condenser of low impedance to modulation-frequency currents bypassing said resistor, a second load condenser of high impedance to modulation-frequency currents and of low impedance to carrier-frequency currents connected between the other terminal of said tertiary winding and the junction point between said resistor and one of said rectifiers, a further resistor connected in series with said second condenser and said tertiary winding, said resistor having a resistance comparable to the effective impedance of said rectifiers to improve the rejection by said detector of an undesired amplitude-modulation component of said wave, and a circuit coupled to said load condenser for deriving a modulation output voltage from said detector.

6. A ratio detector for demodulating an angle-modulated carrier wave comprising a frequency-discriminator network, a pair of rectifiers coupled to said network, a rectifier output circuit, a load condenser included in said rectifier output circuit for developing a modulation output voltage, and a resistor connected for carrier-frequency currents between said network and the output of said rectifiers, said load condenser having a reactive impedance to said wave and said resistor having a resistance of the order of the effective impedance of said rectifiers to improve the rejection by said detector of an undesired amplitude-modulation component of said wave.

7. A ratio detector for demodulating an angle-modulated carrier wave comprising a frequency-discriminator network, a pair of rectifiers coupled to said network, a resistor connected to the output of said rectifiers to form a direct current path with said rectifiers, a first condenser of low impedance to modulation-frequency currents bypassing said resistor, a second load condenser connected from a point on said network to the junction point between said resistor and one of said rectifiers, a further resistor in series with said second condenser, said second load condenser having a reactive impedance to said wave and said further resistor having a resistance of the order of the effective impedance of said rectifiers to improve the rejection by said detector of an undesired amplitude-modulation component of said wave, and a circuit coupled to said load condenser for deriving a modulation output voltage from said detector.

8. A ratio detector for demodulating an angle-modulated carrier wave comprising a frequency-discriminator network, a pair of rectifiers coupled to said network, a rectifier output circuit coupled to said rectifiers, a resistor connected to said pair of rectifiers, a stabilizing condenser connected in parallel with said resistor, said resistor and stabilizing condenser having a time constant that is long compared to a cycle of the angle-modulation component of the wave, and said rectifier output circuit including a load condenser connected to at least one of said rectifiers for developing thereacross a modulation output voltage, said load condenser having a reactive impedance to said wave of the order of the effective impedance of said rectifiers to improve the rejection by said detector of an undesired amplitude-modulation component of said wave.

9. The combination with a source of an angle-modulated carrier wave of a ratio detector comprising a frequency-discriminator network, two rectifiers coupled to said network, a resistor connected in series with said rectifiers to form a direct current path therewith, a first condenser of low impedance to modulation-frequency currents bypassing said resistor, a second load condenser connected between a point on said network and the junction point between said first condenser and one of said rectifiers, said second load condenser having a reactive impedance to said wave of the order of the effective impedance of said rectifiers to improve the rejection by said detector of an undesired amplitude-modulation component of said wave, and a circuit coupled to said second load condenser for deriving a modulation output voltage from said detector.

10. The combination with a source of an angle-modulated carrier wave of a ratio detector comprising a frequency-discriminator network, said network including a transformer having a primary winding, a secondary winding and a tertiary winding having one terminal connected to the midpoint of said secondary winding, two rectifiers coupled to said network, a resistor connected in series with said rectifiers to form a direct current path therewith, a first condenser of low impedance to modulation-frequency currents bypassing said resistor, a second load condenser connected between the other terminal of said tertiary winding and the junction point between said first condenser and one of said rectifiers, said second load condenser having a reactive impedance to said wave of the order of the effective impedance of said rectifiers to improve the rejection by said detector of an undesired amplitude-modulation component of said wave, and a circuit coupled to said second load condenser for deriving a modulation output voltage from said detector.

11. The combination with a source of an angle-modulated carrier wave of a ratio detector comprising a frequency-discriminator network, two rectifiers coupled to said network, a resistor connected in series with said rectifiers to form a direct current path therewith, a first condenser of low impedance to modulation-frequency currents bypassing said resistor, a pair of load condensers connected in parallel with said resistors, the junction point between said pair of condensers being connected to a point on said pair of load condensers having a reactive impedance to said wave of the order of the effective impedance of said rectifiers to improve the rejection by said detector of an undesired amplitude-modulation component of said wave, and a circuit coupled to one of said pair of load condensers for deriving a modulation output voltage from said detector.

12. A ratio detector for demodulating an angle-modulated carrier wave comprising a frequency-discriminator network, a pair of rectifiers coupled to said network, a rectifier output circuit connected to said rectifiers for developing a modulation output voltage, a resistor and a condenser connected in parallel, said resistor being connected to said rectifiers to form a series path with said rectifiers, said resistor and condenser having a time constant that is long compared to a cycle of said modulation output voltage, and a further resistor connected between said network and said output circuit, said further resistor having a resistance of the order of the effective impedance of said rectifiers to improve the rejection by said detector of an undesired amplitude-modulation component of said wave.

EARL I. ANDERSON.

REFERENCES CITED

The following references are of record in the file of this patent:

UNITED STATES PATENTS

| Number | Name | Date |
|---|---|---|
| 2,341,240 | Reid | Feb. 8, 1944 |

OTHER REFERENCES

"Ratio Detectors for FM Receivers," pages 18, 19 and 20 of "Radio" for October 1945.